(12) United States Patent
Hughes

(10) Patent No.: US 11,134,575 B2
(45) Date of Patent: Sep. 28, 2021

(54) DUAL CONDUCTOR LAMINATED SUBSTRATE

(71) Applicant: Gentherm Inc., Northville, MI (US)

(72) Inventor: Timothy Hughes, South Lyon, MI (US)

(73) Assignee: Gentherm GmbH

( * ) Notice: Subject to any disclaimer, the term of this patent is extended or adjusted under 35 U.S.C. 154(b) by 0 days.

(21) Appl. No.: 16/587,292

(22) Filed: Sep. 30, 2019

(65) Prior Publication Data

US 2021/0100109 A1    Apr. 1, 2021

(51) Int. Cl.
*H05K 1/09*    (2006.01)
*H05K 3/04*    (2006.01)
(Continued)

(52) U.S. Cl.
CPC ......... *H05K 3/4626* (2013.01); *H05K 1/0313* (2013.01); *H05K 1/09* (2013.01); *H05K 1/115* (2013.01); *H05K 3/0032* (2013.01); *H05K 3/0044* (2013.01); *H05K 3/04* (2013.01); *H05K 3/1225* (2013.01); *B60R 16/0207* (2013.01); *H05K 2201/0145* (2013.01); *H05K 2201/0154* (2013.01); *H05K 2201/09227* (2013.01); *H05K 2203/0228* (2013.01); *H05K 2203/107* (2013.01); *H05K 2203/166* (2013.01)

(58) Field of Classification Search
CPC .... B60R 16/0207; H05K 1/0313; H05K 1/09; H05K 1/115; H05K 1/024; H05K 3/4626; H05K 3/0032; H05K 3/0044; H05K 3/04; H05K 3/1225; H05K 2201/0154; H05K 2201/09227; H05K 2203/0228; H05K 2203/107; H05K 2203/166; H01L 21/481; H01L 21/486; H01L 23/49827; H01L 23/49894; H01L 23/66
USPC .......................................... 174/257; 257/774
See application file for complete search history.

(56) References Cited

U.S. PATENT DOCUMENTS 3,555,964 A    1/1971    Fleming
3,995,969 A    12/1976   Fleming
(Continued)

FOREIGN PATENT DOCUMENTS

EP    0562670 A1    9/1993
EP    1157821 A1    11/2001
(Continued)

OTHER PUBLICATIONS

Printed circuit board milling - Wikipedia_pages 1-4_Dec 2016.*
(Continued)

*Primary Examiner* — Timothy J Thompson
*Assistant Examiner* — Guillermo J Egoavil

(57) ABSTRACT

A method for manufacturing a dual conductor laminated substrate includes providing a first laminate including a first insulating layer and a first conductive layer; defining a first trace pattern including one or more traces in the first laminate; providing a second laminate including a second insulating layer and a second conductive layer; defining a second trace pattern including one or more traces in the second laminate; defining access holes in the second insulating layer; at least one of depositing and stenciling a conductive material in the access holes of the second insulating layer; and aligning and attaching the first laminate to the second laminate to create a laminated substrate.

11 Claims, 5 Drawing Sheets

(51) Int. Cl.
*H05K 1/03* (2006.01)
*H05K 1/11* (2006.01)
*H05K 3/00* (2006.01)
*H05K 3/12* (2006.01)
*H05K 3/46* (2006.01)
*B60R 16/02* (2006.01)

(56) References Cited

U.S. PATENT DOCUMENTS

| | | | | |
|---|---|---|---|---|
| 6,133,142 | A * | 10/2000 | Tran | H01L 21/32135 |
| | | | | 257/E21.31 |
| 6,184,463 | B1 * | 2/2001 | Panchou | H01L 22/00 |
| | | | | 174/548 |
| 6,847,527 | B2 * | 1/2005 | Sylvester | H01L 21/4857 |
| | | | | 174/255 |
| 7,919,027 | B2 | 4/2011 | Nordlinder et al. | |
| 2003/0054579 | A1 * | 3/2003 | Pakbaz | H01L 51/0004 |
| | | | | 438/22 |
| 2004/0012938 | A1 * | 1/2004 | Sylvester | H01L 23/49822 |
| | | | | 361/794 |
| 2007/0057375 | A1 * | 3/2007 | Nakamura | H01L 21/4857 |
| | | | | 257/758 |
| 2007/0093620 | A1 * | 4/2007 | Rickert | H05K 3/4673 |
| | | | | 525/523 |
| 2015/0054174 | A1 * | 2/2015 | Lo | H01L 24/03 |
| | | | | 257/774 |
| 2018/0114747 | A1 * | 4/2018 | Delacruz | H01L 23/49827 |
| 2018/0219294 | A1 * | 8/2018 | Oh | H01Q 5/378 |
| 2019/0150296 | A1 * | 5/2019 | Southworth | H05K 1/0243 |
| | | | | 361/807 |
| 2019/0163298 | A1 * | 5/2019 | Shiojiri | H05K 3/101 |
| 2019/0355681 | A1 * | 11/2019 | Kong | H05K 1/024 |

FOREIGN PATENT DOCUMENTS

| | | | | |
|---|---|---|---|---|
| GB | | 1134632 A * | 11/1968 | H05K 3/4092 |
| WO | WO-2005027599 A1 | | 3/2005 | |

OTHER PUBLICATIONS

Fly Cutting Milling _ pp. 1-2_Apr. 2015.*
Printed circuit board milling—Wikipedia_pp. 1-4_Dec. 2016.*
International Search Report and Written Opinion dated Jan. 18, 2021 corresponding to International Application No. PCT/US2020/052704, 14 pages.

* cited by examiner

DUAL CONDUCTOR LAMINATED SUBSTRATE

FIELD

The present disclosure relates to laminated substrates, and more particularly to laminated substrates including two conductive layers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

As electronic systems in vehicles become more complex, an increasing number of devices need to be connected together. In most vehicles, complex wiring harnesses with individual wires are used. The wiring harnesses are prone to failures and are difficult to manufacture.

SUMMARY

A method for manufacturing a dual conductor laminated substrate includes providing a first laminate including a first insulating layer and a first conductive layer; defining a first trace pattern including one or more traces in the first laminate; providing a second laminate including a second insulating layer and a second conductive layer; defining a second trace pattern including one or more traces in the second laminate; defining access holes in the second insulating layer; at least one of depositing and stenciling a conductive material in the access holes of the second insulating layer; and aligning and attaching the first laminate to the second laminate to create a laminated substrate.

In other features, the method includes aligning and attaching a third insulating layer to the second conductive layer; defining access holes in the first insulating layer; and defining access holes in the third insulating layer.

In other features, the method includes heating the laminated substrate to cause the conductive material to flow. The method includes curing the conductive material.

In other features, the first trace pattern defines overhanging portions relative to at least one of the access holes in the second insulating layer; and the conductive material is arranged in the at least one of the access holes in the second insulating layer.

In other features, at least one of the first trace pattern in the first conductive layer or the second trace pattern in the second conductive layer. At least one of the access holes in the first insulating layer or the access holes in the second insulating layer are dry milled. At least one of the access holes in the first insulating layer and the access holes in the second insulating layer are fly cut. At least one of the access holes in the first insulating layer and the access holes in the second insulating layer are laser ablated.

In other features, the first conductive layer and the second conductive layer comprise a material selected from a group consisting of copper and aluminum. The first insulating layer comprises a material selected from a group consisting of polyethylene terephthalate (PET), polyethylene naphthalate (PEN), or polyimide (PI). The conductive material is selected from a group consisting of solder, conductive ink and conductive adhesive.

A dual conductor laminated substrate includes a first insulating layer. A first conductive layer is attached to the first insulating layer and defines a first trace pattern including one or more traces. A second insulating layer is attached to the first conductive layer and defines access holes. A second conductive layer is attached to the second insulating layer and defines a second trace pattern including one or more traces. Conductive material is located in at least one of the access holes of the second insulating layer to connect a trace in the first trace pattern to a trace in the second trace pattern.

In other features, at least one of the first insulating layer and the second insulating layer includes access holes. The conductive material is heated to cause the conductive material to flow. The conductive material is cured.

In other features, the first trace pattern defines overhanging portions relative to one of the access holes in the second insulating layer. The conductive material is arranged in the one of the access holes in the second insulating layer. At least one of the first trace pattern in the first conductive layer or the second trace pattern in the second conductive layer is dry milled. At least one of the access holes in the first insulating layer or the access holes in the second insulating layer are dry milled. At least one of the access holes in the first insulating layer and the access holes in the second insulating layer are fly cut. At least one of the access holes in the first insulating layer and the access holes in the second insulating layer are laser ablated.

In other features, the first conductive layer and the second conductive layer comprise a material selected from a group consisting of copper and aluminum. The first insulating layer and the second insulating layer comprise a material selected from a group consisting of polyethylene terephthalate (PET), polyethylene naphthalate (PEN), or polyimide (PI). The conductive material is selected from a group consisting of solder, conductive ink and conductive adhesive.

A method for manufacturing a dual conductor laminated substrate includes providing a first laminate including a first insulating layer and a first conductive layer; defining a first trace pattern including one or more traces in the first laminate; attaching a second insulating layer including one or more access holes to the first laminate; at least one of depositing and stenciling conductive material in the one or more access holes of the second insulating layer; providing a second laminate including a second conductive layer and a third insulating layer; defining a second trace pattern including one or more traces in the second laminate; and aligning and attaching the second laminate to the second insulating layer.

In other features, the method includes at least one of defining access holes in the first insulating layer; and defining access holes in the third insulating layer. The conductive material is heated to cause the conductive material to flow. The conductive material is cured. The first trace pattern defines overhanging portions relative to at least one of the access holes in the second insulating layer. The conductive material is arranged in the at least one of the access holes in the second insulating layer.

In other features, at least one of the first trace pattern in the first laminate or the second trace pattern in the second laminate is dry milled. At least one of the access holes in the first insulating layer and the access holes in the second insulating layer are dry milled. At least one of the access holes in the first insulating layer and the access holes in the second insulating layer are fly cut. At least one of the access holes in the first insulating layer and the access holes in the second insulating layer are laser ablated.

In other features, the first conductive layer and the second conductive layer comprise a material selected from a group consisting of copper and aluminum. The first insulating layer and the second insulating layer comprise a material selected from a group consisting of polyethylene terephthalate (PET), polyethylene naphthalate (PEN), or polyimide (PI). The conductive material is selected from a group consisting of solder, conductive ink and conductive adhesive.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to a laminated substrate including first and second conductive layers sandwiched between insulating layers. The first and second conductive layers are patterned to include first and second trace patterns, respectively. Access holes in outer insulating layers allow external connections to be made to traces in the first trace pattern and traces in the second trace pattern.

Access holes in the insulating layer located between the first conductive layer and the second conductive layer allow connections to be made between the traces in the first trace pattern and the traces in the second trace pattern. To allow connections between a trace in the first trace pattern and a trace in the second trace pattern, the first trace pattern or the second trace pattern includes overhanging portions relative to an aligned access hole in the second insulating layer. Conductive material (such as solder, conductive ink, or conductive adhesive) is stenciled or deposited in the access hole and heated after lamination to reflow or otherwise cure the conductive material and make the connection between the trace in the first trace pattern and the trace in the second trace pattern.

Figure 1:
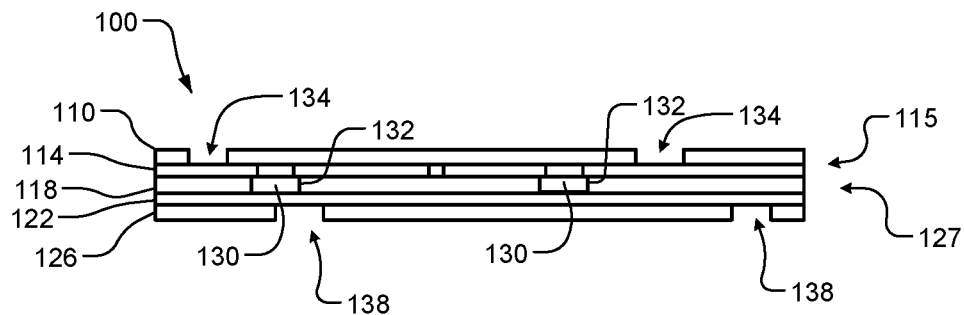
FIG. 1 is a side cross-sectional view of an example of a laminated substrate including two conductive layers according to the present disclosure.

Referring now to FIG. 1, a laminated substrate 100 includes a first insulating layer 110, a first conductive layer 114, a second insulating layer 118, a second conductive layer 122 and a third insulating layer 126. A first laminate 115 including the first insulating layer 110 and the first conductive layer 114 is patterned (prior to attachment to a second laminate 127) to define a first trace pattern including one or more traces. Access holes 134 are created in the insulating layer 118. In some examples, the first laminate 115 is dry milled to create the first trace pattern and/or the access holes 134, although other methods (such as photolithography or laser ablation) can be used to create the first trace pattern and/or the access holes 134 can be fly cut.

Likewise, a second laminate 127 including the second insulating layer 118 and the second conductive layer 122 is patterned (prior to attachment to the first laminate 115) to define a second trace pattern including one or more traces. Access holes 132 are formed in the second insulating layer 118. In some examples, the second laminate 127 is dry milled to create the second trace pattern and/or the access holes 138, although other methods (such as photolithography or laser ablation) can be used to create the second trace pattern and/or the access holes 132 can be fly cut.

Conductive material 130 is arranged in selected ones of the access holes 132 located in the second insulating layer 118. In some examples, the conductive material 130 is stenciled and/or deposited. The first laminate 115 and the second laminate 127 are aligned and attached using adhesive or other methods. The third insulating layer 126 is aligned and attached to the second conductive layer 122. Access holes 138 of the third insulating layer 126 can be pre-cut before attachment or dry milled, laser ablated or fly cut after attachment.

The conductive material 130 is heated to reflow the conductive material 130 and to create a connection between traces in the first trace pattern in the first conductive layer 114 and traces in the second trace pattern in the second conductive layer 122.

Figure 2:
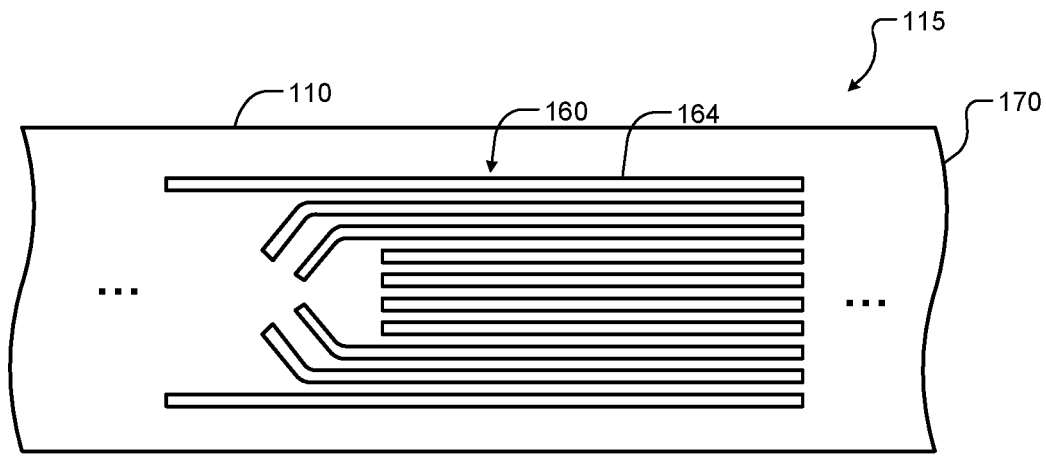
FIG. 2 is a plan view of an example of a first trace pattern patterned in a first conductive layer according to the present disclosure.

Referring now to FIG. 2, a first trace pattern 160 including one or more traces 164 is defined in the first conductive layer 114 of the first laminate 115. In some examples, the first laminate 115 comprises a continuous web 170 and the first trace pattern 160 is repeated at regularly spaced intervals on the continuous web 170.

In some examples, the conductive layer 114 and the insulating layer 110 are dry milled to create the first trace pattern 160. Likewise, the access holes 134 can be dry milled from an opposite side. Alternately, the first trace pattern 160 can be dry milled and the access holes 134 can be fly cut.

A suitable example of a dry milling process is shown and described in U.S. Pat. No. 7,919,027, issued on Apr. 5, 2011 and entitled "Methods and Devices for Manufacturing of Electrical Components and Laminated Structures", which is hereby incorporated herein by reference in its entirety.

During dry milling, a continuous web is fed between a milling wheel and a cliché. The cliché includes a pattern with raised and non-raised portions. The raised portions of the pattern push the laminated structure into the milling wheel in regions adjacent to the raised portions. The non-raised portions are not milled. The non-raised portions of the pattern define the traces in the conductive layer. The raised portions of the pattern define regions between the traces where the conductive layer is removed.

Figure 3:
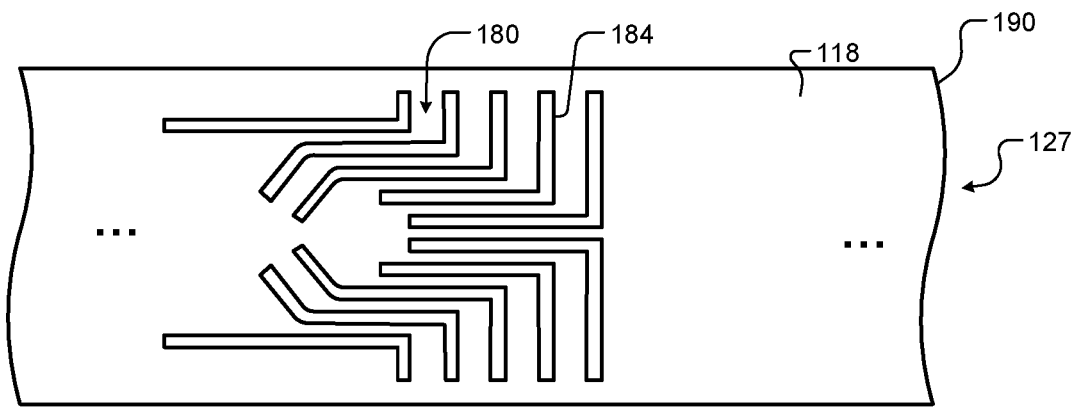
FIG. 3 is a plan view of an example of a second trace pattern patterned in a second conductive layer according to the present disclosure.

Referring now to FIG. 3, a second trace pattern 180 including one or more traces 184 is created in the second conductive layer 122 of the second laminate 127. In some examples, the second laminate 127 comprises a continuous web 190 and the second trace pattern 180 is repeated at regularly spaced intervals on the continuous web 190. The second laminate 127 can be made in a manner similar to the first laminate 115.

Figure 4:
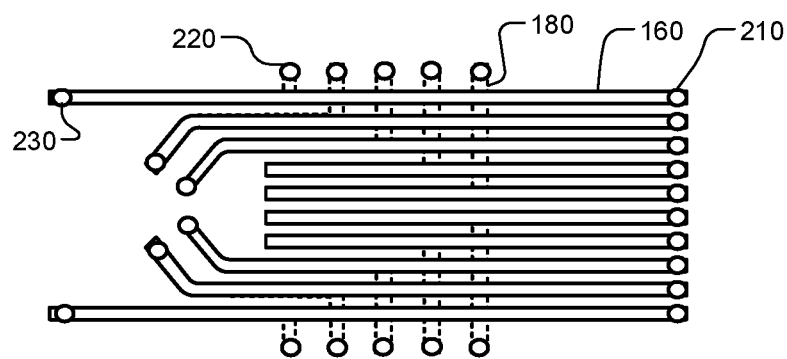
FIG. 4 is a plan view illustrating an example of the first trace pattern overlaying the second trace pattern according to the present disclosure.

Referring now to FIG. 4, the first trace pattern 160 is shown overlaying the second trace pattern 180 (while other portions are omitted for clarity). Access holes and connections between traces can be arranged in various locations as needed. For example, access holes from one side can be located at 210, access holes from an opposite side can be located at 220 and connections between the traces in the first and second trace patterns 160, 180 can be located at 230, although other arrangements can be used.

Figure 5:
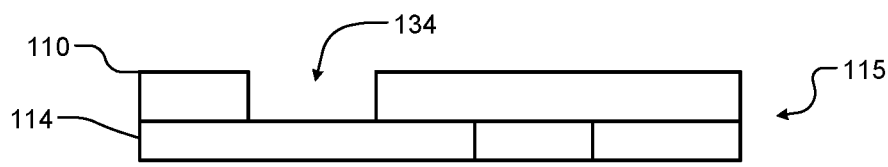
FIG. 5 is an enlarged side cross-sectional view of an example of a first laminate including the first insulating layer and the first conductive layer according to the present disclosure.
Figure 6:
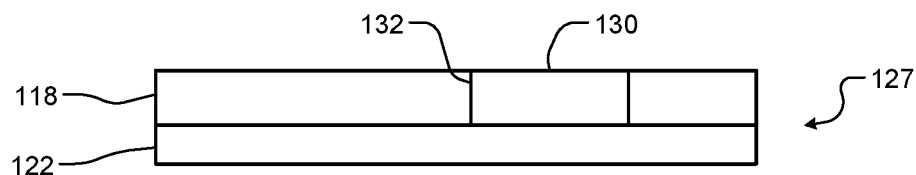
FIG. 6 is an enlarged side cross-sectional view of an example of a second laminate including the second insulating layer and the second conductive layer according to the present disclosure.
Figure 7:
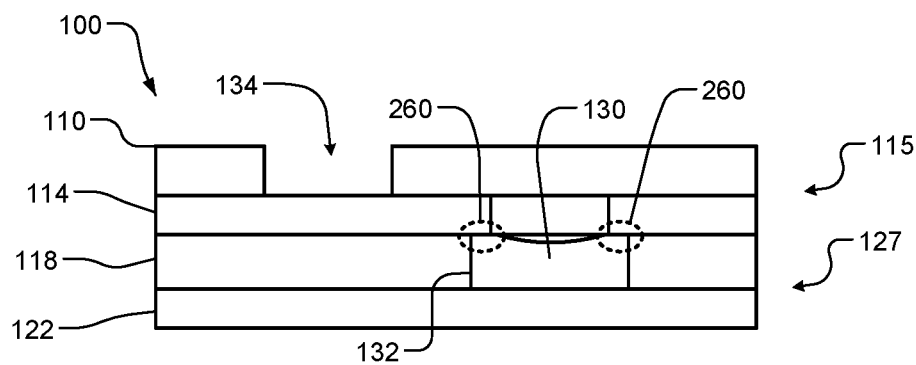
FIG. 7 is an enlarged side cross-sectional view of a laminated structure that combines both the first and second laminates into a single structure, and includes selectively placed conductive material to electrically connect the traces of the first and second laminates through openings in the insulator of the first laminate at pre-selected locations.

Referring now to FIG. 5-7, after the first laminate 115 and the second laminate 127 are patterned, they are aligned and attached together. In FIG. 5, the first laminate 115 includes the first insulating layer 110 and the first conductive layer 114. In some examples, the first trace pattern 160 defines overhanging portions 260 (FIG. 7) relative to aligned access holes 132 in the second insulating layer 118.

In FIG. 6, the second laminate 127 includes the second insulating layer 118 and the second conductive layer 122. The conductive material 130 is stenciled and/or deposited in the access holes of the first laminate 115 and/or the second laminate 127. In FIG. 7, the first laminate 115 and the second laminate 127 are aligned and attached together. Heat may be applied to reflow the conductive material 130 and to create a connection between traces of the first laminate 115 and/or the second laminate 127. The third insulating layer 126 can be aligned and attached before or after the conductive material 130 is reflowed.

In some examples, the first trace pattern 160 defined in the first conductive layer 114 includes portions that are offset inwardly relative to an underlying one of the access holes 132 to create the overhanging portions 260 of the first conductive layer 114. When heated, the conductive material 130 flows and creates an electrical connection between the second conductive layer 122 and the overhanging portions 260 of the first conductive layer 114. As can be appreciated, the overhanging portions 260 can be patterned in the second conductive layer 122 instead of the first conductive layer 114.

Figure 8:
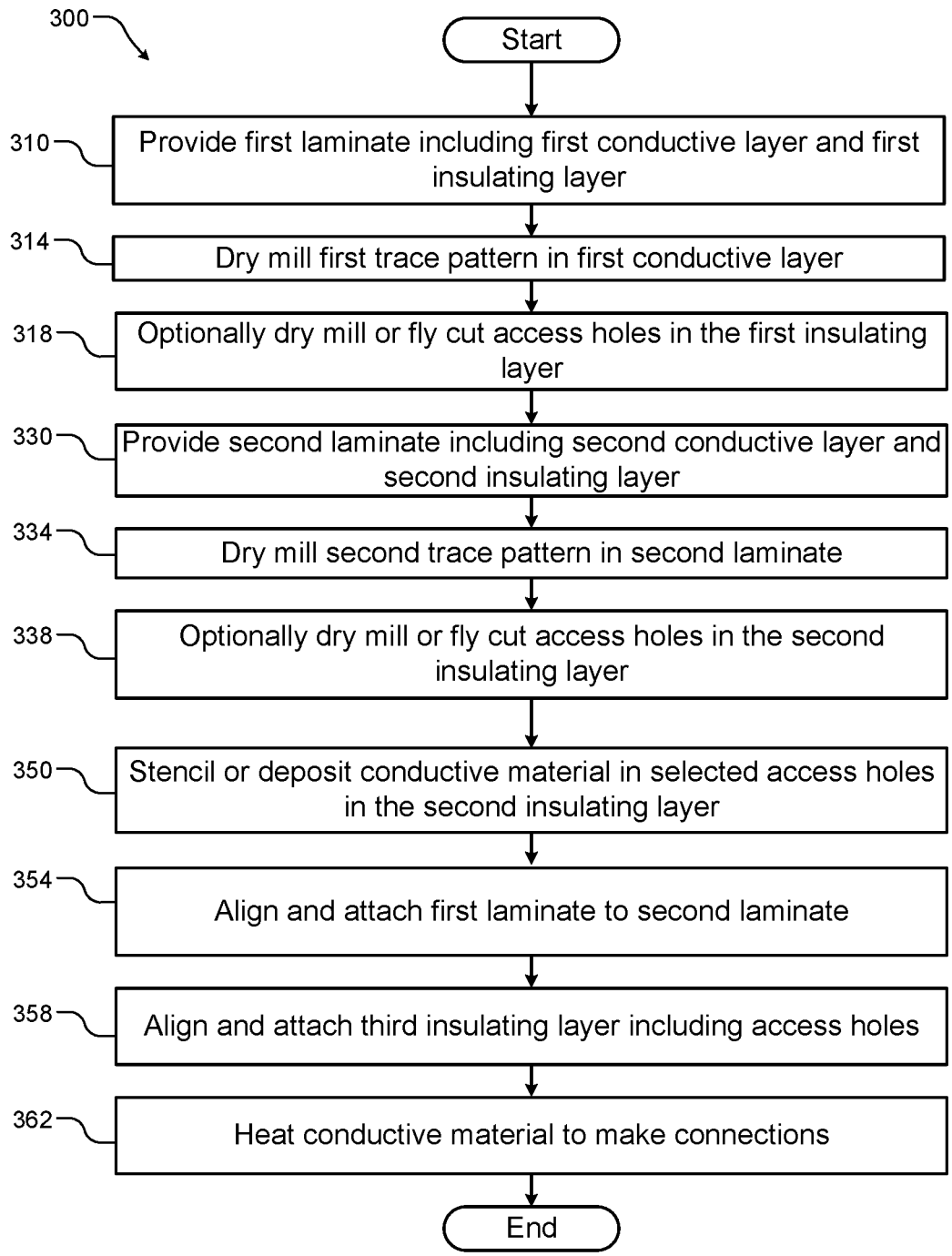
FIG. 8 is a flowchart of an example of a method for fabricating the laminated substrate of FIGS. 1 to 7 according to the present disclosure.
Figure 9:
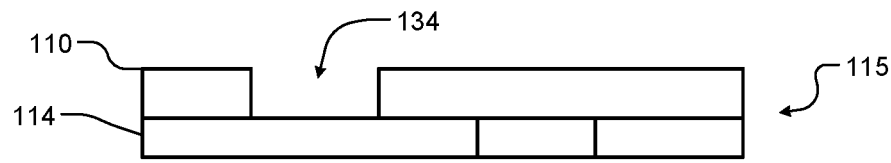
FIG. 9 is an enlarged side cross-sectional view of an example of a first laminate including the first insulating layer and the first conductive layer according to the present disclosure.

Referring now to FIG. 8, a method 300 for fabricating the laminated substrate 100 of FIGS. 1 to 7 is shown. At 310, the first laminate 115 is provided and includes the first insulating layer 110 and the first conductive layer 114. At 314, the first trace pattern 160 is dry milled in the first laminate 115. At 318, the access holes 134 can be dry milled or fly cut in the first insulating layer 110. In some examples, the first trace pattern 160 defines the one or more overhanging portions 260 relative to the access holes 132 in the second insulating layer 118.

At 330, a second laminate is provided and includes a second conductive layer and a second support layer. At 334, the second trace pattern 180 is dry milled in the second laminate. At 338, the access holes 134 can be dry milled, laser ablated or fly cut in the second insulating layer 118. In some examples, the second trace pattern 180 defines overhanging portions 260 relative to access holes 132 in the second insulating layer 118.

At 350, the conductive material 130 is stenciled or deposited in selected ones of the access holes 132 in the second insulating layer 118. At 354, the first laminate 115 is attached to the second laminate 127 to create the laminated substrate 100. At 358, a third insulating layer 126 including the one or more access holes 138 is aligned and attached to the conductive layer 122 of the laminated substrate 100. Alternately, the third insulating layer 126 can be attached and then the access holes 138 can be dry milled or fly cut after attachment. At 362, the conductive material 130 is heated to create connections between one or more traces in the first trace pattern 160 and one or more traces in the second trace pattern 180.

Figure 10:
FIG. 10 is an enlarged side cross-sectional view of an example of the second insulating layer according to the present disclosure.
Figure 11:
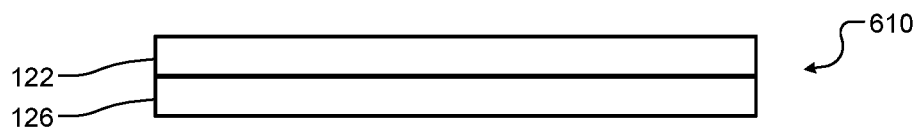
FIG. 11 is an enlarged side cross-sectional view of an example of a second laminate including the second conductive layer and the third insulating layer prior to lamination according to the present disclosure.
Figure 12:
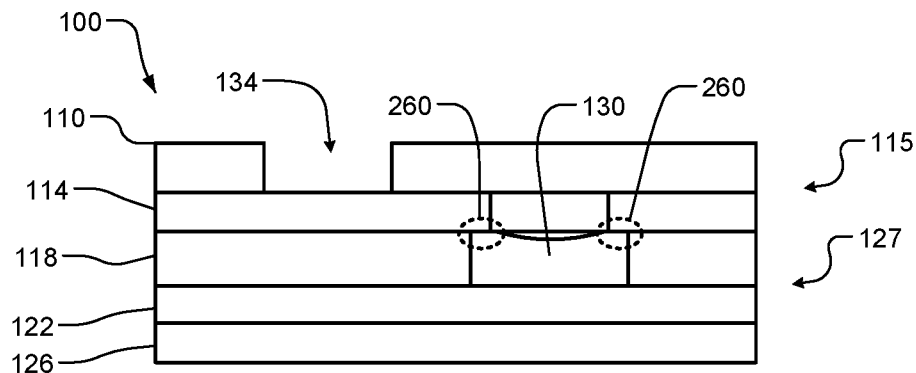
FIG. 12 is an enlarged side cross-sectional view of a laminated structure that combines both the first and second laminates, separated by a secondary electrically insulating layer, and includes selectively placed conductive material to electrically connect the traces of the first and second laminates through openings in the secondary insulator at pre-selected locations.

Referring now to FIGS. 9-12, the laminated substrate 100 can be made in other ways. For example, in FIG. 9, the first laminate 115 includes the first insulating layer 110 and the first conductive layer 114. In FIG. 10, the second insulating layer 118 is attached between the first laminate 115 and a second laminate 610. In FIG. 11, the second laminate 610 includes the second conductive layer 122 and the third insulating layer 126. In FIG. 12, the first laminate 115 is attached to the second insulating layer 118. Conductive material 130 is stenciled or deposited in the access holes 132 of the second insulating layer 118. The second laminate 610 is attached to the second insulating layer 118. The laminated substrate 100 is heated to flow the conductive material 130 or cured.

Figure 13:
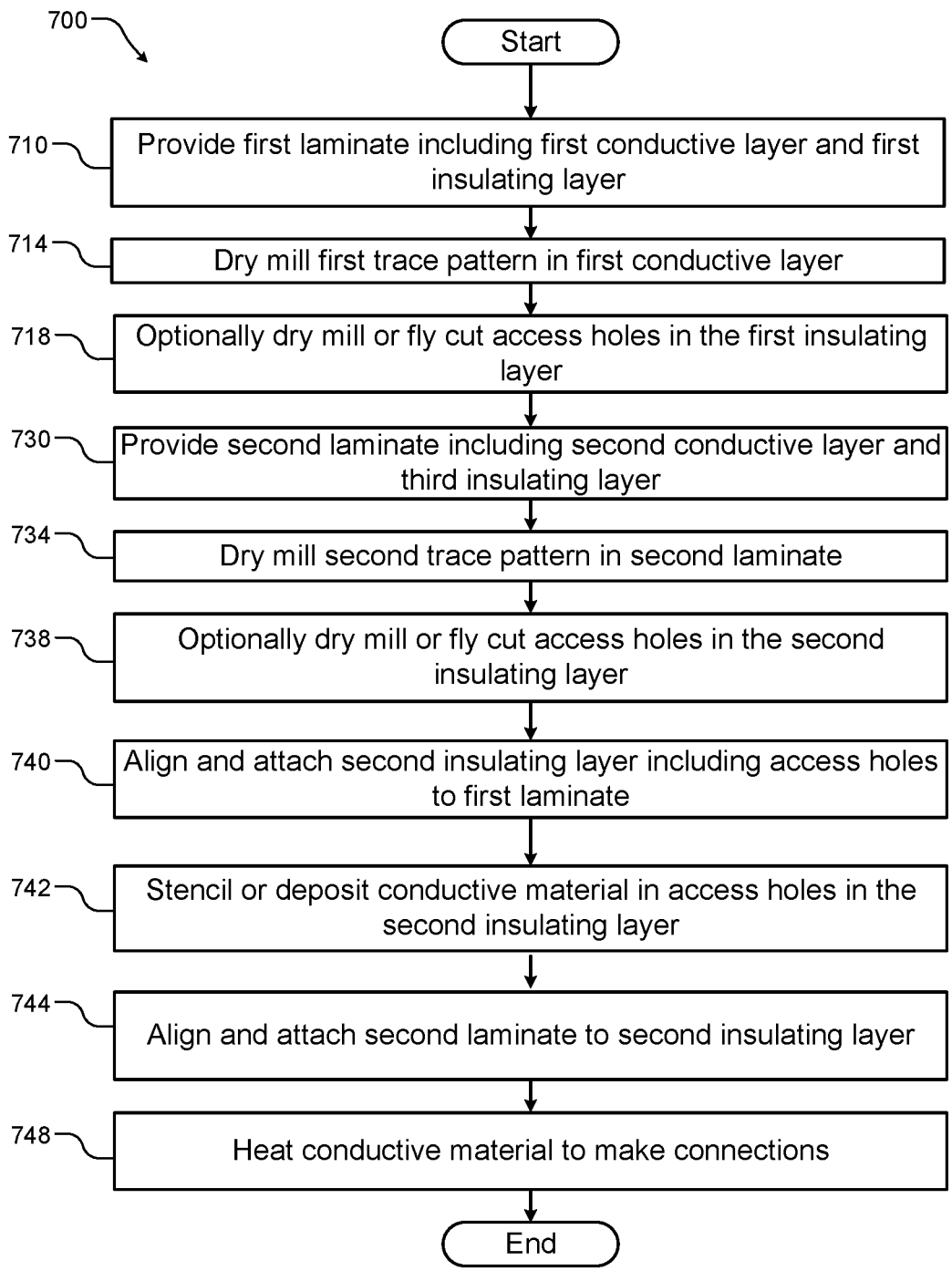
FIG. 13 is a flowchart of an example of a method for fabricating the laminated substrate of FIGS. 9 to 12 according to the present disclosure.

Referring now to FIG. 13, a method 700 for fabricating the laminated substrate of FIGS. 9 to 12 is shown. At 710, the first laminate 115 is provided and includes the first insulating layer 110 and the first conductive layer 114. At 714, the first trace pattern 160 is dry milled in the first laminate 115. At 718, the access holes 134 can be dry milled, laser ablated or fly cut in the first insulating layer 110. In some examples, the first trace pattern 160 defines the one or more overhanging portions 260 relative to the access holes 132 in the second insulating layer 118.

At 730, the second laminate 610 is provided and includes the second conductive layer 122 and the third insulating layer 126. At 734, a second trace pattern is dry milled in the second laminate 610. At 738, the access holes 134 can be dry milled, laser ablated or fly cut in the second insulating layer 118. At 740, the second insulating layer 118 including the access holes 132 is aligned and attached to the first laminate 115.

At 742, the conductive material 130 is stenciled or deposited in selected ones of the access holes 132 in the second insulating layer 118. At 744, the second laminate 610 is aligned and attached to the second insulating layer 118. At 748, the conductive material 130 is heated or cured to create connections between one or more traces in the first trace pattern 160 and one or more traces in the second trace pattern 180.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A dual conductor laminated substrate, comprising:
   a first insulating layer;
   a first conductive layer attached to the first insulating layer and defining a first trace pattern including one or more traces;
   a second insulating layer attached to the first conductive layer and defining access holes;
   a second conductive layer attached to the second insulating layer and defining a second trace pattern including one or more traces; and
   conductive material located in at least one of the access holes of the second insulating layer to connect a trace in the first trace pattern to a trace in the second trace pattern;
   wherein the first trace pattern defines overhanging portions relative to one of the access holes in the second insulating layer;
   wherein the conductive material is arranged in the one of the access holes between opposite ends of adjacent overhanging portions in the second insulating layer; and
   wherein the first conductive layer includes portions that are offset inwardly relative to underlying one of the access holes.

2. The dual conductor laminated substrate of claim 1, wherein:
   the first insulating layer includes access holes; and
   the second insulating layer includes access holes.

3. The dual conductor laminated substrate of claim 1, wherein the conductive material includes at least one of a heated conductive material and a cured conductive material.

4. The dual conductor laminated substrate of claim 1, wherein at least one of the first trace pattern and the second trace pattern includes a dry milled trace pattern.

5. The dual conductor laminated substrate of claim 1, wherein at least one of the first insulating layer and the second insulating layer includes dry milled access holes.

6. The dual conductor laminated substrate of claim 1, wherein at least one of the first insulating layer and the second insulating layer includes fly cut access holes.

7. The dual conductor laminated substrate of claim 1, wherein at least one of the first insulating layer and the second insulating layer includes laser ablated access holes.

8. The dual conductor laminated substrate of claim 1, wherein the first conductive layer and the second conductive layer comprise a material selected from a group consisting of copper and aluminum.

9. The dual conductor laminated substrate of claim 1, wherein the first insulating layer and the second insulating layer comprise a material selected from a group consisting of polyethylene terephthalate (PET), polyethylene naphthalate (PEN), or polyimide (PI).

10. The dual conductor laminated substrate of claim 1, wherein the conductive material is selected from a group consisting of solder, conductive ink and conductive adhesive.

11. The dual conductor laminated substrate of claim 1, wherein at least one of the first conductive layer and the second conductive layer includes a dry milled conductive layer.

* * * * *